(12) United States Patent
Kingsborough (10) Patent No.: US 7,141,844 B1
(45) Date of Patent: Nov. 28, 2006

(54) SELECTIVE POLYMER GROWTH FOR MEMORY CELL FABRICATION

(75) Inventor: Richard P. Kingsborough, North Chelmsford, MA (US)

(73) Assignee: Spansion, LLC, Sunnyvale, CA (US)

( * ) Notice: Subject to any disclaimer, the term of this patent is extended or adjusted under 35 U.S.C. 154(b) by 0 days.

(21) Appl. No.: 11/000,740

(22) Filed: Dec. 1, 2004

(51) Int. Cl.
*H01L 27/108* (2006.01)

(52) U.S. Cl. .................... 257/296; 257/40; 257/313; 257/314; 257/E51.003

(58) Field of Classification Search .............. 257/296, 257/40

See application file for complete search history.

(56) References Cited

U.S. PATENT DOCUMENTS

2006/0038169 A1* 2/2006 Mandell et al. .............. 257/40

OTHER PUBLICATIONS

D. Fu, et al. "Solventless Polymerization at the Gas-Solid Interface to Form Polymeric Thin Films", Advanced Materials, 2002. vol. 14 ,Issue 5, pp. 339-343.

* cited by examiner

*Primary Examiner*—Tu-Tu Ho
(74) *Attorney, Agent, or Firm*—Amin & Turocy, LLP (57) ABSTRACT

Systems and methodologies of growing an active layer (e.g., a polymer layer) for a memory cell via catalyst points of a self assembled monolayer (SAM). The self assembled monolayer can act as a site that anchors a subsequent growth of polymer chain reactions, via the presence of the DPA that reacts with the active catalyst spots. The DPA can react with a surface of the self assembled monolayer to form an active layer of the polymer memory cell.

20 Claims, 9 Drawing Sheets

SELECTIVE POLYMER GROWTH FOR MEMORY CELL FABRICATION

TECHNICAL FIELD

The subject invention relates generally to polymer memory cell fabrication, and in particular to systems and methods that employ a self assembled monolayer as a catalyst site to anchor growth of an active layer for polymer memory cells.

BACKGROUND OF THE INVENTION

The proliferation and increased usage of portable computer and electronic devices has greatly increased demand for memory cells. Digital cameras, digital audio players, personal digital assistants, and the like generally seek to employ large capacity memory cells (e.g., flash memory, smart media, compact flash, or the like). Memory cells can be typically employed in various types of storage devices. Example of storage devices can include long term storage mediums such as, hard disk drives, compact disk drives and corresponding media, digital video disk (DVD) drives, and the like. The long term storage mediums typically store larger amounts of information at a lower cost, but are slower than other types of storage devices. Storage devices also include memory devices which are often, but not always, short term storage mediums.

Also, memory cells can generally be subdivided into volatile and non-volatile types. Volatile memory cells usually lose their information if they lose power and typically require periodic refresh cycles to maintain their information. Volatile memory cells include, for example, random access memory (RAM), DRAM, SRAM and the like. Non-volatile memory cells maintain their information whether or not power is maintained to the devices. Examples of non-volatile memory cells include; ROM, programmable read only memory (PROM), erasable programmable read only memory (EPROM), electrically erasable programmable read only memory (EEPROM), flash EEPROM the like. Volatile memory cells generally provide faster operation at a lower cost as compared to non-volatile memory cells. Nonetheless, to retain the information, the stored data typically must be refreshed; that is, each capacitor must be periodically charged or discharged to maintain the capacitor's charged or discharged state. The maximum time allowable between refresh operations depends on the charge storage capabilities of the capacitors that make up the memory cells in the array. The memory device manufacturer typically specifies a refresh time that guarantees data retention in the memory cells.

As such, each memory cell in a memory device can be accessed or "read", "written", and "erased" with information. The memory cells maintain information in an "off" or an "on" state (e.g., are limited to 2 states), also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices.

Because of the increasing demand for information storage, memory device developers and manufacturers are constantly attempting to increase storage capacity for memory devices (e.g., increase storage per die or chip) while reducing associated costs. A postage-stamp-sized piece of silicon may contain tens of millions of transistors, each transistor as small as a few hundred nanometers. However, silicon-based devices are approaching their fundamental physical size limits.

Therefore, there is a need to overcome the aforementioned deficiencies associated with conventional systems.

SUMMARY OF THE INVENTION

The following presents a simplified summary of the invention in order to provide a basic understanding of one or more aspects of the invention. This summary is not an extensive overview of the invention. It is intended to neither identify key or critical elements of the invention, nor to delineate the scope of the subject invention. Rather, the sole purpose of this summary is to present some concepts of the invention in a simplified form as a prelude to the more detailed description that is presented hereinafter.

The subject invention provides for systems and methods of growing an active layer (e.g., a polymer layer) for a memory cell, by employing a self assembled monolayer (SAM) that is positioned over a passive layer, and that provides catalyst points as a site for anchoring sequential polymerized growth of a polymer in presence of a monomer (e.g., diphenylacetylene.) Typically, the active layer can change an impedance state (e.g., from a high resistance to a low resistance) when subject to a stimulus such as a voltage or current, and the passive layer (super-ionic) can facilitate ion injection into the active layer, thus increasing concentration of ions and conductivity modifications of the active layer.

According to one aspect of the subject invention, a self assembled monolayer, such as an aromatic, or aliphatic acetylene, can be initially formed on a copper sulfide layer by introducing a generic+-monomer functionalized such that it is capable of forming self-assembled monolayers, and also including in the structure a terminal acetylene unit (e.g., 4-ethynylthiophenol or 2-propynethiol) to the copper sulfide layer via a number of techniques including dip-coating or spraying a solution of the SAM molecule and evaporation of the solvent. The monomer can react with the copper sulfide layer, to begin initiation of a polymer growth. For example, a compound such as described above containing both a functional unit capable of forming a self-assembled monolayer and a terminal acetylene unit can react with the copper sulfide layer, first forming the SAM then initiating polymer growth therefrom. Such polymer growth can then self terminate and create active catalyst spots with the catalyst residing on the SAM molecule. The catalyst spots can then re-initiate sequential polymer growth in presence of diphenylacetylene (DPA), which can be introduced as a monomer, for example in form of a gas phase medium.

As such, the initial self assembled monolayer can act as a site that anchors a subsequent polymer chain reactions, initiated via the presence of the DPA. The DPA can react with the active catalyst spots at surface of the self assembled monolayer to grow individual polymer chains at every spot that there exist a catalyst. It is to be appreciated that other phenylacetylene compounds such as nitrophenylacetylene, methylphenyacetylene, nitrodiphenylacetylene, and the like can also be employed, as the monomer. As such, the subject invention can facilitate selective growth of polymer layers without typically performing sequential steps of fabricating co-polymers.

In a related aspect of the subject invention, growth of the polymer layer can be accelerated by an absence of light, and a control system can monitor and regulate polymer and layer(s) formation on various parts of a wafer surface. Such control component can further comprise a monitoring component (e.g., a scatterometry system) to detect polymer formation on the wafer surface. If irregularities in polymer formation are detected, the control component can for example selectively decrease/increase a plurality of parameters (e.g., DPA concentration, pressure, light exposure, and the like) in order to compensate for the irregularities. In a related aspect of the subject invention based on real time information received from the monitoring component, a control loop can be created, wherein the control component can make determinations regarding whether a suitable rate of polymerizations is present, whether compensatory action was successful in mitigating detected polymerization irregularities and the like. Moreover, inferences can be made regarding, for example, whether to initiate compensatory action to correct detected irregularities. Such inferences can be based on information related to the rate of polymer growth, the location of polymerization, and the like. This can permit increased efficiency and economic benefit by augmenting the criteria germane to making a decision regarding compensating for potentially inadequate polymerization.

To the accomplishment of the foregoing and related ends, the invention, then, comprises the features hereinafter fully described. The following description and the annexed drawings set forth in detail certain illustrative aspects of the invention. However, these aspects are indicative of but a few of the various ways in which the principles of the invention may be employed. Other aspects, advantages and novel features of the invention will become apparent from the following detailed description of the invention when considered in conjunction with the drawings. To facilitate the reading of the drawings, some of the drawings may not have been drawn to scale from one figure to another or within a given figure.

DETAILED DESCRIPTION OF THE INVENTION

The subject invention is now described with reference to the drawings, wherein like reference numerals are used to refer to like elements throughout. In the following description, for purposes of explanation, numerous specific details are set forth in order to provide a thorough understanding of the subject invention. It may be evident, however, that the subject invention may be practiced without these specific details. In other instances, well-known structures and devices are shown in block diagram form in order to facilitate describing the subject invention.

Figure 1:
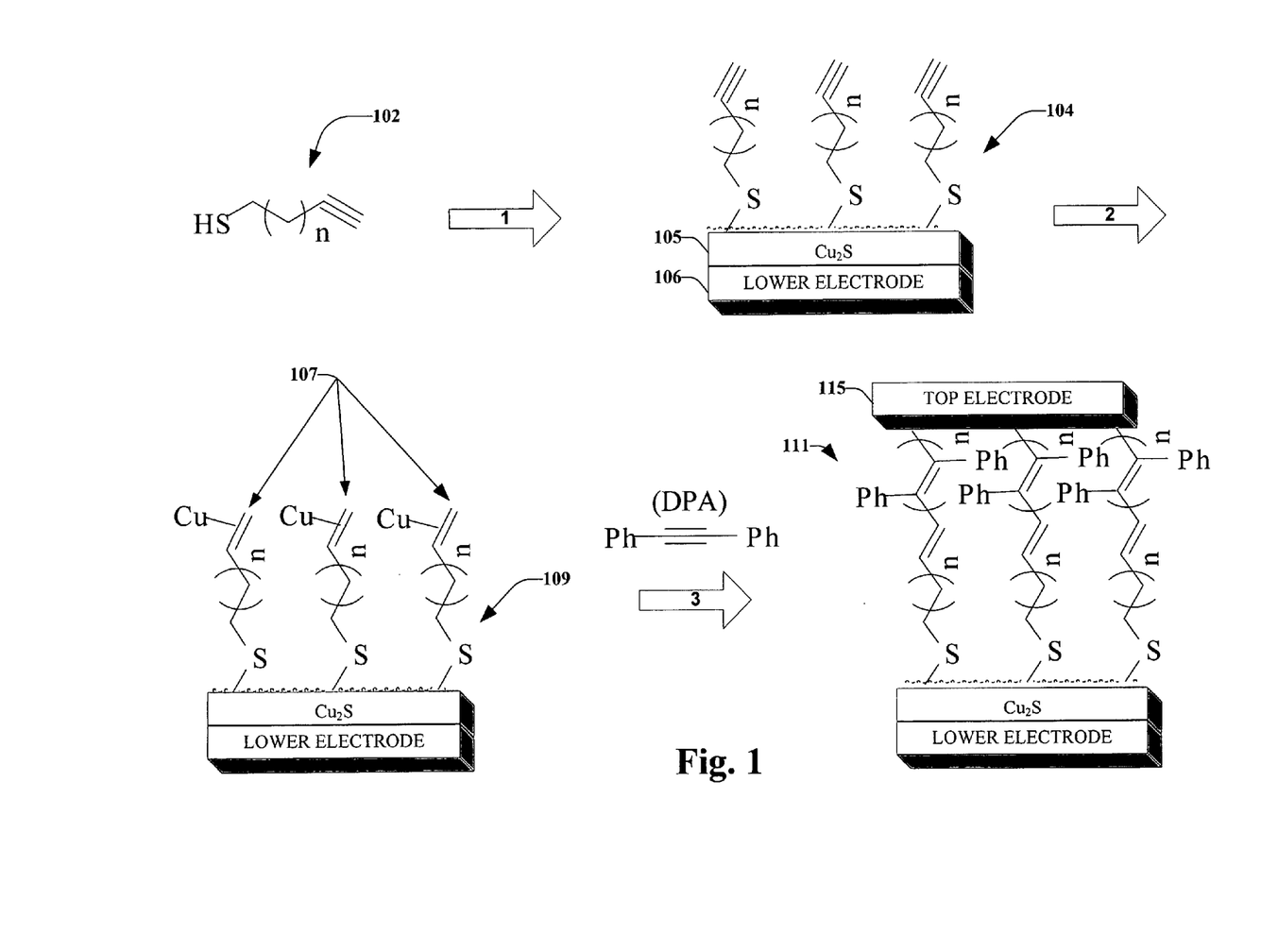
FIG. 1 illustrates a schematic diagram of polymer formation via employing a self assembled monolayer as an anchor site for polymerization growth, according to an exemplary aspect of the subject invention.

The subject invention provides for systems and methods of selectively growing an active layer that includes a polymer media, via catalyst points, for example, in a form of acetylene linkages that can bracket and initiate polymerization from a self assembled monolayer. Referring initially to FIG. 1, various stages of a polymer growth for an active layer in accordance with an aspect of the subject invention is illustrated. Initially, and as indicated by arrow 1, a generic terminated monomer 102 is introduced upon a passive layer 105 (e.g., copper sulfide.) Such generic terminated monomer 102 can be an acetylene compound that interacts with the passive layer 105, which in turn is formed over an electrode layer 106 via a plurality of deposition processes as described in detail infra. An example of a reaction between the self-assembled monolayer compound 102 with the passive layer 105 can be introduction of acetylene-terminated alkylthiol as the monomer 102 over a copper sulfide passive layer 105, wherein its thiol functionality can react and with the copper sulfide layer, to form bracketed structures depicted by 104. The acetylene unit can then react with the copper sulfide passive layer 105 to result in the self-assembled monolayer with the active catalyst site 109. Put differently, the monomer 102 reacts with the copper sulfide layer 105, to begin initiation of a polymer growth, wherein the acetylene compound bound to the copper sulfide layer reacts with the copper sulfide layer. Such polymer growth can then self terminate as there can be a finite and limited number of available bonds, and create active catalyst spots (e.g., points with the terminal acetylene) 107. These active catalyst spots 107 can in turn re-initiate sequential polymer growth in presence of diphenylacetylene (DPA), which can be introduced as a monomer, as illustrated by arrow 3. The DPA for example can be in form of a gas phase medium at elevated temperatures.

Accordingly, the initial self assembled monolayer 109 with catalyst spots 107, can act as a site that anchors a subsequent polymer chain reactions—for example initiated via the presence of the DPA that reacts with the active catalyst spots 107. The DPA can react at surface of the self assembled monolayer 109 to grow individual polymer chains at every spot 107 where a catalyst exists. After formation of such polymer chains for the active layer 111 of a memory cell, a top electrode 115 can be positioned on top of the active layer to sandwich the various passive/active layers between the top electrode 115, and the lower electrode.

Figure 2:
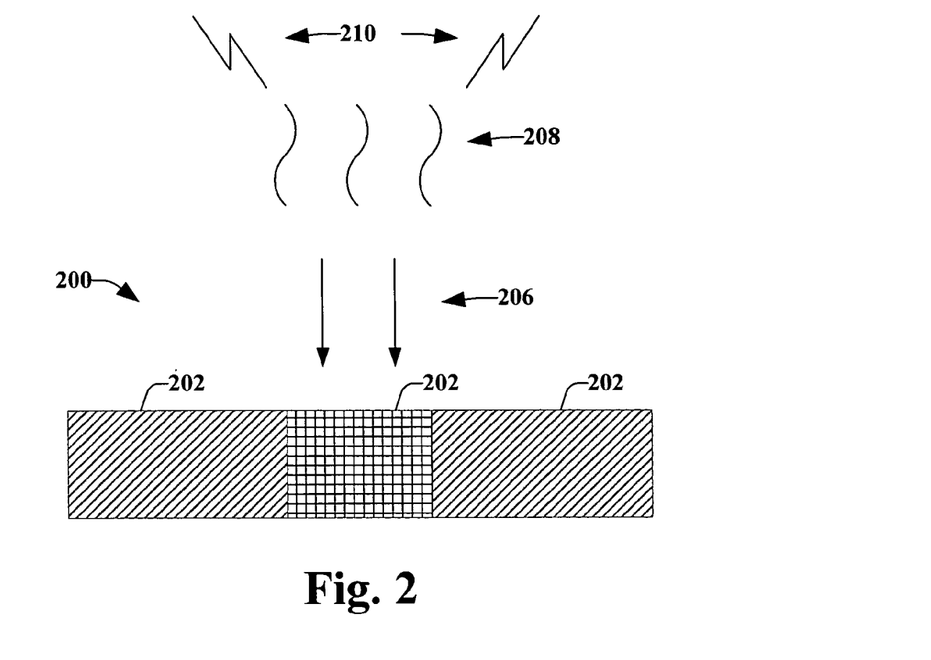
FIGS. 2 & 3 illustrate a formation of a copper sulfide passive layer that form a base for the self assembled monolayer in accordance with an aspect of the subject invention.
Figure 3:
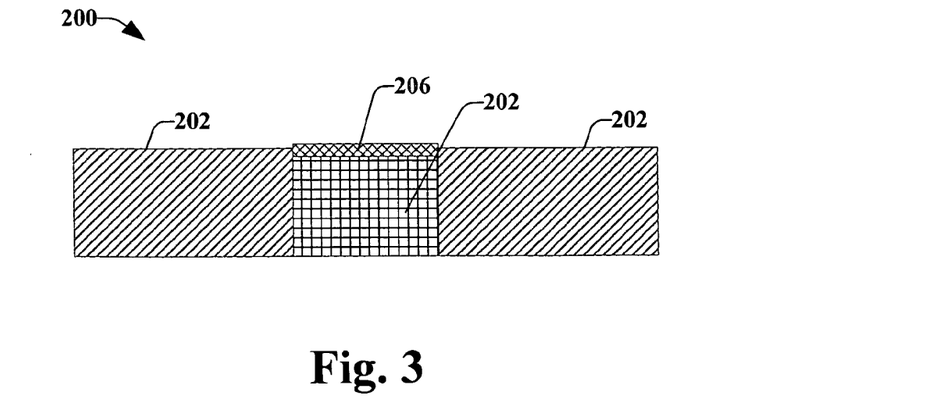

FIG. 2 and FIG. 3 illustrate a formation of a copper sulfide layer that can act as a base for the self assembled monolayer in accordance with an aspect of the subject invention. In general, a conductivity facilitating material such as copper sulfide ($Cu_2S$, CuS) can be formed on the conductive layer (e.g., lower electrode) to act as a passive layer, and facilitate ion injection into the active layer grown via a polymer chain reaction from active sites of the self assembled monolayer. The copper sulfide ($Cu_2S$, CuS) can be formed as a thin film on the conductive layer via plasma enhanced chemical vapor deposition. Hydrogen sulfide 206 in FIG. 2 can be introduced above the conductive layer 202 (which can be comprised of a plurality of conductive materials as described in detail infra), with helium optionally being utilized as a carrier gas. The copper sulfide formation can be a selective deposition process, which is typically performed only on exposed Cu portions. A thermal or plasma sulfidation techniques with H2S can be employed. Moreover, $Cu_2S$ can also be thermally deposited via thermal evaporation (e.g., for larger scale blanket type structures.) The polymer growth also occurs on the exposed Cu2S surface. In a related aspect, with copper on the bottom of the via can also be employed to produce similar effects. As such, the dimension of the $Cu_2S$ can be defined by the dimension of the Cu plug/via.

Figure 4:
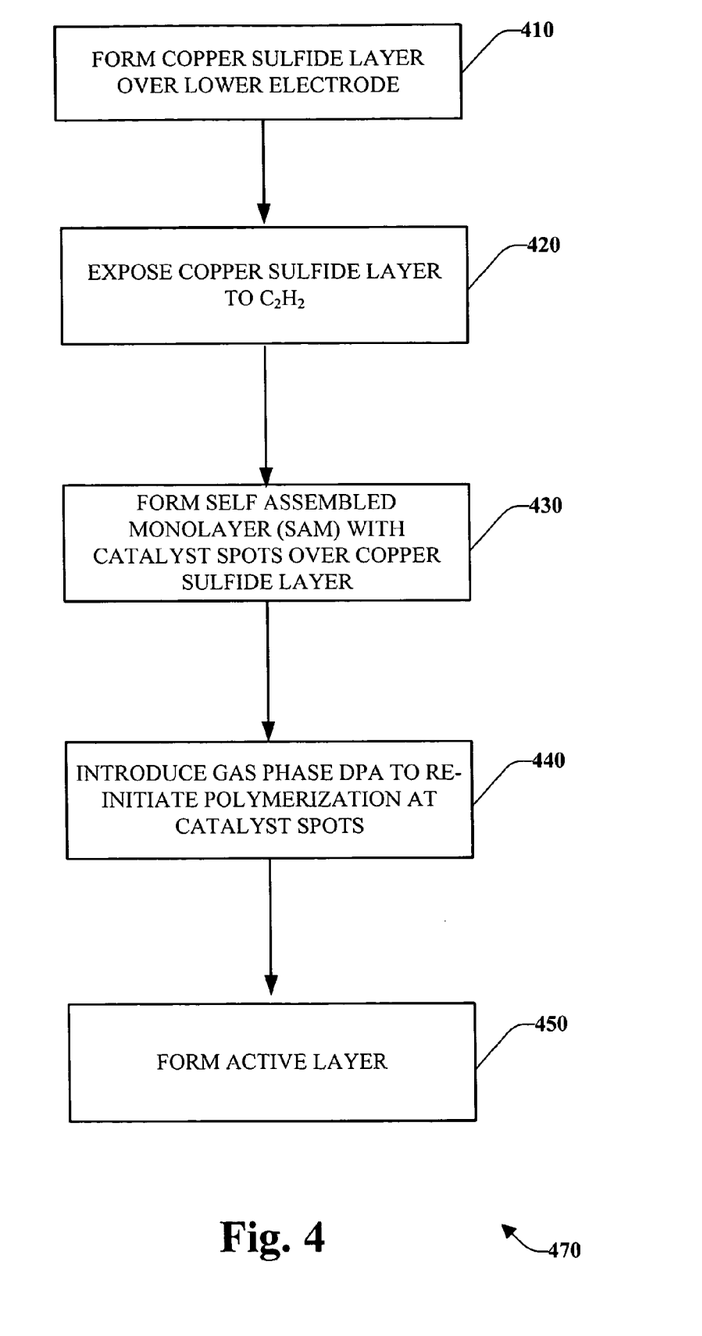
FIG. 4 illustrates a particular methodology in accordance with an aspect of the subject invention.

FIG. 4 illustrates a methodology according to one aspect of the subject invention for sequential growth of polymer chains from catalyst spots of the self assembled monolayer. Initially, and at 410 a passive copper sulfide layer can be deposited over a lower conductive electrode as described in detail supra. Next, and at 420 such passive layer can be exposed to a self-assembled monolayer monomer containing a terminal acetylene unit. Such exposure can occur within a chamber and under a controlled environment as will be described in detail infra. The SAM monomer such introduced, can have a functional unit that reacts with the copper sulfide layer to initiate the formation of the self-assembled monolayer and then react with the copper sulfide layer to initiate polymer growth thereon at 430. Such polymer growth can be self terminating as there can be a finite and limited number of available bonds. Nonetheless, this reaction can create active catalyst spots. Introduction of gas phase diphenylacetylene (DPA) at 440 as a monomer can re-initiate sequential polymer growth. Put differently, the initial self assembled monolayer created at 430 can act as a site that anchors a subsequent of polymer chain reactions availed via the presence of the DPA at 440, which reacts with the active catalyst spots. The DPA can react at surface of the self assembled monolayer, which functions as catalyst site to grow individual polymer chains at every spot that there exist a catalyst, to form the active layer at 450. Upon this active layer a top electrode can be positioned to form a memory cell according to one aspect of the subject invention.

While the exemplary method is illustrated and described herein as a series of blocks representative of various events and/or acts, the subject invention is not limited by the illustrated ordering of such blocks. For instance, some acts or events may occur in different orders and/or concurrently with other acts or events, apart from the ordering illustrated herein, in accordance with the invention. In addition, not all illustrated blocks, events or acts, may be required to implement a methodology in accordance with the subject invention. Moreover, it will be appreciated that the exemplary method and other methods according to the invention may be implemented in association with the method illustrated and described herein, as well as in association with other systems and apparatus not illustrated or described.

Figure 5:
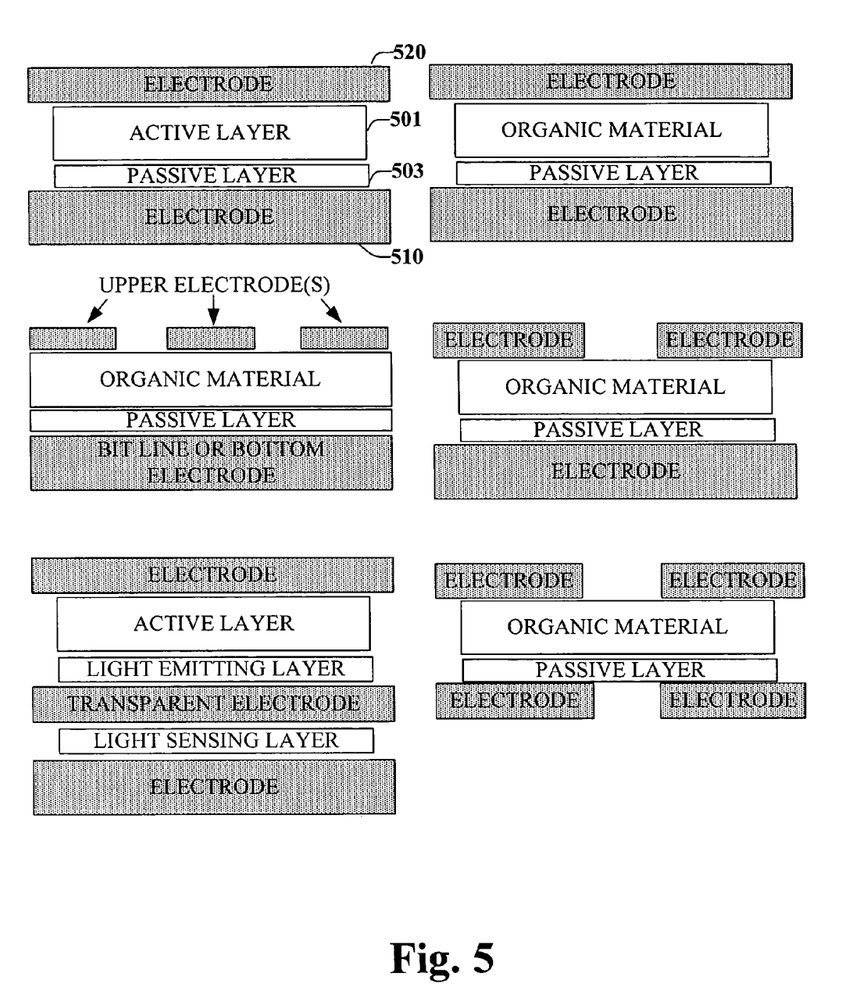
FIG. 5 illustrates structures of memory cells with various exemplary electrode arrangements and passive/active layers that can be fabricated by a selective polymerization in accordance with an aspect of the subject invention.

FIG. 5 illustrates various structures of memory cells with various exemplary electrode arrangements and passive/active layers that can be fabricated in accordance with the subject invention. Typically for such memory cells, upper and lower electrodes sandwich various other active and passive layers. The electrodes (e.g. 510, 520) can be comprised of a conductive material such as, aluminum, chromium, cobalt, copper, germanium, gold, magnesium, manganese, molybdenum, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys.

The thickness of the electrodes can vary depending on the implementation and the memory device being constructed. However, some exemplary thickness ranges include about 100 nm or more and about 10 um or less for 510 and 520. The electrodes can be placed in an alternating fashion among various layers of for example semiconductor layers, polymer layers, and passive layers. The active layer 501 can change an impedance state (e.g., from a high resistance to a low resistance) when subject to a stimulus such as a voltage or current. An active molecule or molecular group forming the active layer 501 can be one that changes a property when subjected to an electrical field and/or light radiation, (e.g., ionizable group); such as: nitro group, amino group, cyclopentadienyl, dithiolane, methylcyclopentadienyl, fulvalenediyl, indenyl, fluorenyl, cyclobis(paraquart-p-phenylene), bipyridinium, phenothiazine, diazapyrenium, benzonitrile, benzonate, benzamide, carbazole, dibenzothiophene, nitrobenzene, aminobenzenesulfonate, aminobenzoate, and molecular units with redox-active metals; metallocenes (Fe, V, Cr, Co, Ni and the like) complex, polypyridine metal complex (Ru, Os and the like). A set of functional groups that can attach to the DPA units include nitro, methyl, methoxy, tifluoromethyl, amino, dialkylamino and the like. The active layer can change its impedance state by undergoing a redox reaction along the polymer backbone in which the polymer can, for example, either oxidize or reduce by the application of an electric field or by doping by a copper ion.

In another aspect of the subject invention, the active layer 501 can include polymers such as polyphenylacetylene, polydiphenylacetylene and related derivatives with active molecular groups. It is to be appreciated that other suitable and related chemical compounds can also be employed including: aromatic hydrocarbons; organic molecules with donor and acceptor properties (N-Ethylcarbazole, tetrathiotetracene, tetrathiofulvalene, tetracyanoquinodimethane, tetracyanoethylene, cloranol, dinitro-n phenyl and so on); metallo-organic complexes (bisdiphenylglyoxime, bisorthophenylenediimine, tetraaza-tetramethylannulene and so on); porphyrin, phthalocyanine, hexadecafluoro phthalocyanine and their derivatives with active molecular group.

In a related aspect of the subject invention, the active layer 501 can comprise; polymer polyphenylacetylene+molecules of chloranil or tetracyano-quino-dimethane or dichlordicyanoquinone, copper phthalocyanine (which can be deposited by thermal deposition method to about 30 Å–1000 Å); copper hexadecafluoro phthalocyanine, amorphous carbon or palladium, (which can be deposited on the upper surface of the active layer by magnetron co-sputtering); and polysilanes with N-carbazolylpropyl group; polymer polytiophene with cyclopentadienyl groups; polysilanes with cyclopentadienyl groups; polysilanes with amino groups; polythiophene with alkyl amino groups; polythiophene with cyclopentadienyl alkyl groups; composite containing polydiphenylacetylene containing carbazolyl groups and dinitro-n-phenyl (DNP); polyethylenedioxythiophene and porous ferroelectric (polyvinyline fluoride) containing $LiCF_3SO_3$ salt, polyethylenedioxythiophene and salt of potassium hexycyanoferrate. The active layer 501 can also comprise silver and/or hydrogen ions.

As depicted in FIG. 5, the active layer 501 can be formed over the passive layer 503 on top of a conductive layer 510, to fabricate layers of a polymer memory cell. The active layer 501 can be fabricated via a number of suitable techniques. One such technique involves growing the active layer 501 in the form of an organic layer from the passive layer 503, as described in detail supra. Likewise, chemical vapor deposition (CVD) techniques can also be employed. Typically, CVD can include low pressure chemical vapor deposition (LPCVD), atmospheric pressure CVD (APCVD), In a related aspect of the invention, the active layer 501 is comprised of a conjugated organic material, such as a small organic molecule and a conjugated polymer. If the organic layer is polymer, a polymer backbone of the conjugated organic polymer may extend lengthwise between conducting layer 510 and a top conducting electrode 520 placed on the active layer 501 after a treatment thereof with post treatment compound (e.g., generally substantially perpendicular to the inner, facing surfaces of the conducting layer 510). The conjugated organic molecule can be linear or branched such that the backbone retains its conjugated nature. Such conjugated molecules are characterized in that they have overlapping $\pi$ orbitals and that they can assume two or more resonant structures. The conjugated nature of the conjugated organic materials facilitates control of properties associated with the memory cell fabricated from such layers. In this connection, the conjugated organic material of the active layer 501 has the ability to donate and accept charges (holes and/or electrons), and trap ions. Generally, the conjugated organic molecule has at least two relatively stable oxidation-reduction states. The two relatively stable states permit the conjugated organic polymer to donate and accept charges, when interacting with the passive (superionic) layer. Moreover when employing CVD techniques, it is not generally necessary to functionalize one or more ends of the organic molecule in order to attach it to the passive layer 503. Sometimes such organic molecules can have a chemical bond formed between the conjugated organic polymer of the active layer 501 and the passive layer 503.

In one particular aspect of the subject invention, the organic material employed as part of the active layer can be cyclic or acyclic. For some cases, such as organic polymers, the organic material can self assemble during formation or deposition. Examples of conjugated organic polymers include one or more of polyacetylene (cis or trans); polyphenylacetylene (cis or trans); polydiphenylacetylene; and the like. Typically, polymers formed on the passive layer as the active layer are primarily of the polyphenylacetylene and polydiphenylacetylene family as well as related derivative bearing functional groups such as nitro, methyl, methoxy, and the like.) Additionally, the properties of the organic material can be modified by doping with a suitable dopant.

Such organic material, which in one exemplary aspect can form the active layer 501, has a suitable thickness that depends upon the chosen implementations of the memory cell being fabricated. Some suitable exemplary ranges of thickness for the organic polymer layer, which in part can form the active layer 501, are about 5 nm or more and about 200 nm or less. Similarly, the passive layer 503 can have a suitable thickness that can vary based on the implementation of the memory cell being fabricated. Some examples of suitable thicknesses for the passive layer 503 can be: a thickness of about 5 nm or more and about 200 nm or less.

According to one aspect of the subject invention, the passive layer can be selectively grown, spun-on, deposited upon the conducting layer 510 via gas-phase reaction with the electrode surface, CVD, vacuum thermal evaporation, sputtering, or plasma enhanced chemical vapor deposition (PECVD) utilizing a metal organic (MO) precursor. The deposition process can be monitored and controlled to facilitate, among other things, depositing the conductivity facilitating compound to a desired thickness.

Additionally, the passive layer 503 facilitates metal ion injection into the active layer 501 and increases the concentration of metal ions in the active layer 501 that can modify the conductivity of the active layer 501.

The passive layer 503 contains at least one conductivity facilitating compound that has the ability to donate and accept ions. Generally, the conductivity facilitating compound has at least two relatively stable oxidation-reduction states that can permit the conductivity facilitating compound to donate and accept ions. Examples of other conductivity facilitating compounds that can be employed for the passive layer 503 include one or more of the following: tungsten oxide ($WO_3$), molybdenum oxide ($MoO_3$), titanium selenide ($TiSe_2$), one or more of copper sulfide ($CU_2S$, CuS), copper oxide (CuO, $Cu_2O$), manganese oxide ($MnO_2$), titanium dioxide ($TiO_2$), indium oxide ($I_3O_4$), silver sulfide ($Ag_2S$), iron oxide ($Fe_3O_4$), and the like. The passive layer 503 may be grown using oxidation techniques, formed via gas phase reactions, or deposited between conducting electrodes of a polymer memory cell. It is to be appreciated that the invention is not so limited and other conducting and/or semi conducting materials can also be employed. The passive layer 503 has a suitable thickness that can vary based on the implementation and/or memory device being fabricated. The passive layer 503 can in some instances act as a catalyst when forming the active layer 501. In this connection, a backbone of a conjugated organic molecule can initially form adjacent the passive layer 503, and grow or assemble away and substantially perpendicular to the passive layer surface. As a result, the backbones of the conjugated organic molecule can be self aligned in a direction that traverses the conducting layer 510 (e.g., copper electrode) The passive layer 503 can be formed by a deposition process (e.g., thermal deposition, PVD, non-selective CVD, and the like) or by a complete sulfidation of pre-deposited thin Cu layer.

As explained supra, the passive layer 503 is operative to transport ions from electrode 510 to the interface between the active (e.g., organic) layer 501 and the passive layer 503. Additionally, the passive layer 503 facilitates ion injection into the active layer 501 and increases the concentration of the ions in the active layer resulting in a modification of the conductivity of the active layer 501. In addition, the passive layer 503 can in some instances act as a catalyst when forming the active layer 501. In this connection, backbone of the conjugated organic molecule may initially form adjacent the passive layer 503, and grow or assemble away and substantially perpendicular to the passive layer surface. As a result, the backbones of the conjugated organic molecule may be self aligned in a direction that traverses the two electrodes. The discussion infra describes and illustrates ionic concentration and models behavior of such organic memory devices.

In the following example, the active layer is conductive polymer with organic material, and $Cu_2S$ is used as passive layer material. It has relatively strong capability to gain electrons from a contacting polymer and yields the following equations:

$$Cu_2S \rightarrow Cu + Cu_{1.99}S, \text{ and } Cu \rightarrow Cu^+ + e^-$$

Figure 6:
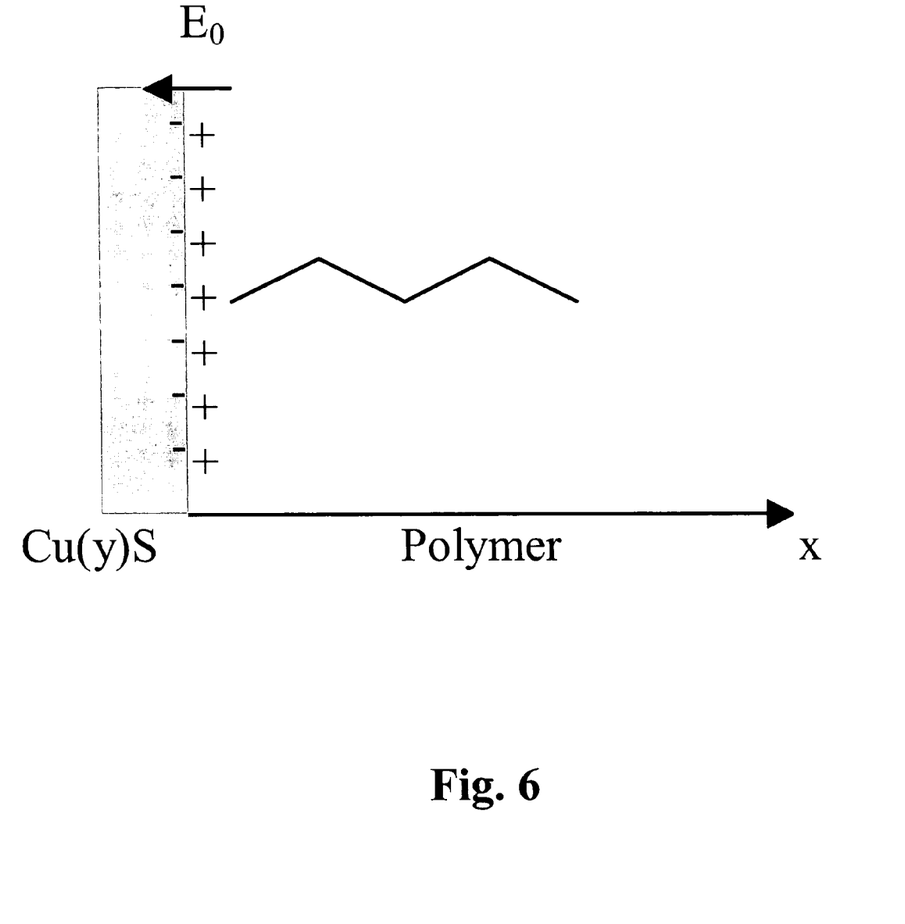
FIG. 6 is a graph depicting the effect of an intrinsic electric field on an interface between a passive layer and a polymer layer in accordance with an aspect of the subject invention.

The consequence is that an intrinsic field is produced due to the charges accumulated on the interface between CuS and polymer. This is shown in FIG. 6, which is a graph depicting the effect of an intrinsic electric field on an interface between $Cu(y)S$ (with y accepting a suitable value e.g. from 1 to 2) and a polymer is provided. The oxidized copper ($Cu^+$) is the charge carrier when external field is applied. The conductivity of polymer is determined by its concentration and its mobility.

$$\sigma = qp\mu \tag{2}$$

Where q is the ionic charge, p is ion concentration and $\mu$ is the mobility.

Figure 7:
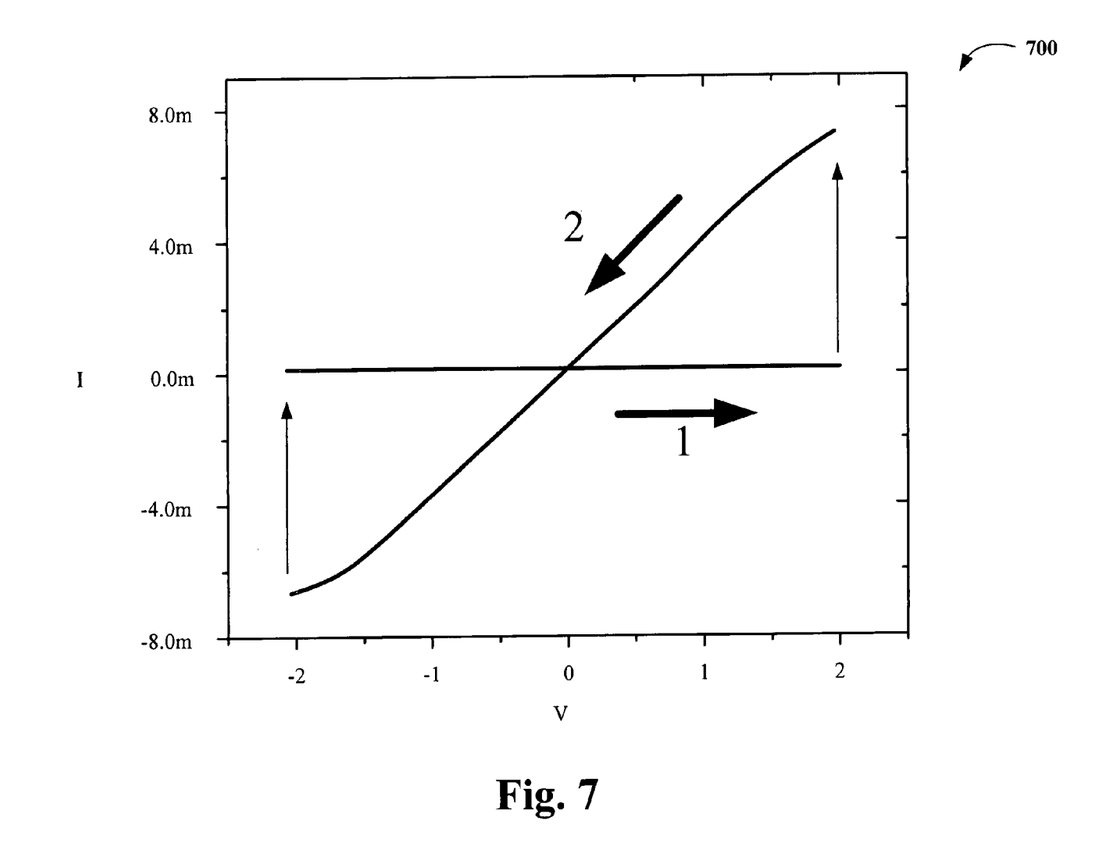
FIG. 7 is a graph illustrating I–V characteristics for an organic memory device in accordance with an aspect of the subject invention.

Referring now to FIG. 7, an exemplary graph 700 is illustrated showing I–V characteristics for a particular organic memory device of the subject invention. As depicted, state 1, which indicates an "off" mode, the device can be modified to be in state 2, which indicates an "on" mode, by applying a positive voltage of 2V. Additionally, it can be seen that whilst in state 1, the organic memory device has a high impedance and low conductance. Subsequently, the organic memory device can be modified to change from state 2 to state 1 by application of a negative voltage therein, causing a reverse current until the state 1 is obtained.

Figure 8:
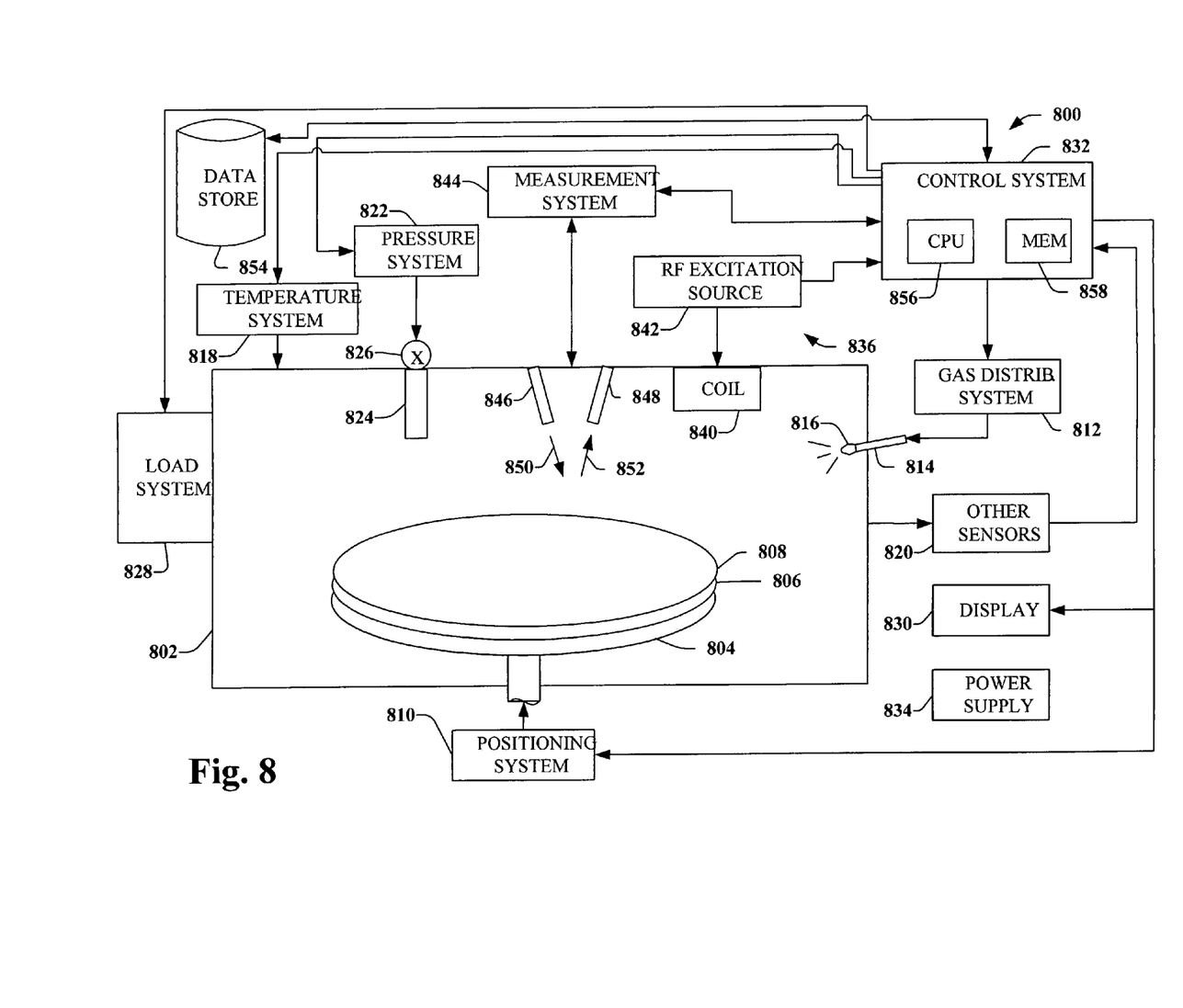
FIG. 8 is a schematic block diagram illustrating a system for growth polymerization in accordance with an aspect of the subject invention.

FIG. 8 is a schematic block diagram illustrating a system 800 for forming a thin film of conductivity facilitating (e.g., copper sulfide ($Cu_2S$, CuS)) on a layer of conductive material (e.g., copper), and/or a self assembled monolayer (SAM) with catalyst points in accordance with one or more aspects of the subject invention. It will be appreciated that formation rates may vary in response to factors including, but not limited to, gas compositions and/or concentrations, excitation voltages, temperatures and/or pressures. The formation described herein can be utilized as part of a semiconductor fabrication process wherein one or more memory cells are produced on a wafer.

The system 800 includes a chamber 802 defined by a housing having a plurality of walls. The chamber 802 includes a support, such as may include a stage 804 (or chuck) operative to support a wafer 806 which includes a layer of conductive material 808 upon which copper sulfide can be selectively formed as part of producing one or more memory cells. A positioning system 810 is operatively connected to the support 804 for selectively maneuvering the wafer 806 into desired positions within the chamber 802. It is to be appreciated that any suitable positioning system may be employed in accordance with one or more aspects of the subject invention. It is to be further appreciated that the conductive material can be copper as well as any other suitable conductive material such as aluminum, chromium, germanium, gold, magnesium, manganese, indium, iron, nickel, palladium, platinum, silver, titanium, zinc, alloys thereof, indium-tin oxide, polysilicon, doped amorphous silicon, metal silicides, and the like. Examples of alloys that can be utilized for the conductive material include Hastelloy®, Kovar®, Invar, Monel®, Inconel®, brass, stainless steel, magnesium-silver alloy, and various other alloys.

A gas distribution system 812 is operatively coupled to the chamber 802 for selectively providing gaseous chemicals into the chamber at various rates, volumes, concentrations, and the like, base upon, among other things, the amount (thickness) of film to be formed, the composition of film(s) to be formed, the pressure within the chamber, the temperature within the chamber and/or the size of the chamber, for example. By way of illustration, the gas distribution system 812 includes one or more sources of gaseous medium (a vapor) of one or more chemical(s). In the example illustrated, the gases are provided into the chamber through a conduit 814 that terminates in a nozzle 816. While, for purposes of brevity, a single nozzle 816 is shown in FIG. 8, it is to be appreciated that more than one nozzle or other gas delivery mechanisms may be utilized to provide gas into the chamber 802 at various mixtures and/or concentrations in accordance with one or more aspects of the subject invention. For example, a shower head type gas delivery mechanism can be implemented to more evenly provide chemicals into the chamber above the wafer 806, which can facilitate a more uniform chemical vapor deposition on and across the wafer. The gas distribution system 812 injects a metal organic gas into the chamber to function as a precursor in the chemical vapor deposition process. The metal organic precursor can be, for example, chelate Cu (II) diethyldithiocarbamate or $Cu(S_2CN(C_2H_5)_2)_2$ (II), which mitigates the need for highly toxic hydrogen sulfide ($H_2S$) within the process. A gaseous form of conductivity facilitating material, such as copper sulfide ($Cu_2S$, CuS), is also provided into the chamber for deposition onto the conductive layer. A gaseous form of helium can also be provided into the chamber along with the copper sulfide to serve as a carrier gas. It will be appreciated that other gases or plasma substances can be injected into the chamber to facilitate depositing the copper sulfide onto the conductive layer.

A temperature system 818 also is provided for selectively regulating the temperature within the chamber 802. For example, the system 818 may be a diffusion type system (e.g., a horizontal or vertical furnace) operable to diffusion heat into the chamber 802. The temperature system 818 may implement its own temperature control process or such control may be implemented as part of other sensors 820 operatively associated with the etching chamber 802. By way of example, the plasma enhanced chemical vapor deposition of copper sulfide can be carried out at a relatively low temperature of between about 400 to 600 K. A pressure system 822 is also included in the system to selectively regulate the pressure within the chamber. The pressure system 822 may include, for example, one or more vent conduits 824 having valves 826 that may be controllably opened and/or closed to varying degrees to assist with selectively adapting the pressure within the chamber 802. The deposition of copper sulfide can similarly be performed at a relatively low pressure of between about 0.05 to 0.5 Pa.

The system 800 can also include a load system 828 operatively connected to the chamber 802 for loading and unloading wafers into and out of the etching chamber. The load system 828 typically is automated to load and unload the wafers into the chamber at a controlled rate. The system further may include a display 830 operatively coupled to a control system 832 for displaying a representation (e.g., graphical and/or textual) of one or more operating parameters (e.g., temperature within the chamber, pressure within the chamber, thickness of material deposited, chart of rate of material being deposited).

A power supply 834 is included to provide operating power to components of the system 800. Any suitable power supply (e.g., battery, line power) suitable for implementation with the subject invention can be utilized. An excitation system 836 is operatively associated with the chamber 802. The system 836 includes a coil 840 and an RF excitation (e.g., voltage) source 842 wherein the coil 840 is excited by the RF excitation source 842 which in turn electrically excites one or more gases within the chamber to facilitate deposition of one or more gases, and in this case the copper sulfide, onto an underlying layer, such as the conductive layer. In particular, an rf plasma field generated by the excited coil and the metal oxide precursor activates the process of depositing the gaseous conductivity facilitating copper sulfide (optionally carried by gaseous helium) onto the conductive layer.

The system can also include a measurement system 844 for in-situ monitoring of processing within the chamber, such as, for example, thickness of film being deposited. The monitoring system 844 can be a standalone component and/or can also be distributed between two or more cooperating devices and/or processes. Similarly, the monitoring system 844 can reside in one physical or logical device (e.g., computer, process) and/or be distributed between two or more physical or logical devices. The measurement system 844 includes one or more non-destructive measurement components, such as may utilize optical interference, scatterometry, IR spectroscopy, ellipsometry, scanning electron microscopy, synchrotron and/or x-ray diffraction techniques. The measurement system includes a beam source 846 and detector 848. It is to be appreciated that while one beam source 846 and one beam detector 848 are shown in the example illustrated, more than one of these components may be included to measure film thickness and/or compositions, for example, at various locations on the wafer. The source portion 846 provides one or more beam(s) 850 (e.g., of light from a frequency stabilized laser, laser diode or helium neon (HeNe) gas laser) toward the surface of the conductive layer 808 on the wafer 806 whereon copper sulfide is deposited. The beam 820 interacts with the film and is altered thereby (e.g., reflected, refracted, diffracted). The altered beam(s) 852 are received at the detector portion 848 of the measurement system 844 and have beam properties (e.g., magnitude, angle, phase, polarization), which can be examined relative to that of the incident beam(s) 850 to determine an indication of one or more properties of the film being deposited (e.g., thickness, chemical species). A plurality of incident beams from one or more sources directed at different spaced apart locations may be employed, for example, to yield corresponding measurements of film thickness at these locations substantially concurrently during the process. The concurrent measurements, in turn, may provide an indication of deposition uniformity and may be useful in controlling the process to efficiently and economically achieve desired results and mitigate the need for and/or degree of subsequent processing steps, such as, for example, selective re-deposition of copper sulfide and/or chemical mechanical polishing at particular locations on the wafer.

With respect to optical interference, for example, the intensity of light over a selected wavelength varies as a function of surface properties (e.g., thickness, chemical composition). For spectroscopic ellipsometry, thickness varies based on the state of polarization of light reflected from the film, which is functionally related to the index of refraction of the material reflecting the beam 852.

Using a scatterometry technique, for example, desired information concerning film thickness and/or chemical composition can be extracted by comparing the phase and/or intensity (magnitude) of the light directed onto the surface of the film with phase and/or intensity signals of a complex reflected and/or diffracted light resulting from the incident light reflecting from the surface of the film upon which the incident light was directed. The intensity and/or the phase of the reflected and/or diffracted light will change based on properties (e.g., thickness, chemical species) of the film upon which the light is directed.

Substantially unique intensity/phase signatures can be developed from the complex reflected and/or diffracted light. The measurement system 844 provides information indicative of the measured properties to the control system 832. Such information may be the raw phase and intensity information. Alternatively or additionally, the measurement system 844 may be designed to derive an indication of film thickness, for example, based on the measured optical properties and provide the control system 832 with a signal indicative of the measured film thickness according to the detected optical properties. The phase and intensity of the reflected light can be measured and plotted to assist with such determinations, such as, for example, by way of derived curve comparisons.

In order to determine film thickness, for example, measured signal characteristics may be compared with a signal (signature) library of intensity/phase signatures to determine properties of the deposited by-products. Such substantially unique phase/intensity signatures are produced by light reflected from and/or refracted by different surfaces due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N = n - jk, \qquad \text{Eq. 1}$$

where j is an imaginary number.

The signal (signature) library can be constructed from observed intensity/phase signatures and/or signatures generated by modeling and simulation.

By way of illustration, when exposed to a first incident light of known intensity, wavelength and phase, a first feature on a surface can generate a first phase/intensity signature. Similarly, when exposed to the first incident light of known intensity, wavelength and phase, a second feature on a surface can generate a second phase/intensity signature. For example, a particular type of film having a first thickness may generate a first signature while the same type of film having a different thickness may generate a second signature, which is different from the first signature. Observed signatures can be combined with simulated and modeled signatures to form the signal (signature) library. Simulation and modeling can be employed to produce signatures against which measured phase/intensity signatures can be matched. Simulation, modeling and observed signatures can, for example, be stored in a signal (signature) library or data store 854 containing, for example, thousands of phase/intensity signatures. Such a data store 854 can store data in data structures including, but not limited to one or more lists, arrays, tables, databases, stacks, heaps, linked lists and data cubes. Thus, when the phase/intensity signals are received from scatterometry detecting components, the phase/intensity signals can be pattern matched, for example, to the library of signals to determine whether the signals correspond to a stored signature. Interpolation between the two closest matching signatures further may be employed to discern a more accurate indication of thickness and/or composition from the signatures in the signature library.

Alternatively, artificial intelligence techniques may be employed to calculate desired parameters based on the detected optical properties.

It is to be appreciated that the beam 850 illustrated in FIG. 8 may be oriented at any angle relative to the surfaces of the wafer with a corresponding detector appropriately positioned for receiving the reflected beam. In addition, more than one beam may be directed toward different locations to measure the respective thickness at such different locations to facilitate a measurement of uniformity or thickness. The thickness of the material being deposited is thus determined based upon the optical properties (e.g., n and k) of emitted and reflected beams 852.

One or more other sensors 820 can also be included to monitor and/or measure selected aspects related to the processing occurring within the chamber (e.g., temperature within the chamber, pressure within the chamber, volume and/or flow rate of gasses being distributed into the chamber). These sensors 820 can provide respective signals to the control system 832 indicative of the aspects sensed thereby. The various other subsystems 812, 818, 822, 836 can further provide respective signals to the control system 832 indicative of operating conditions associated with the respective systems (e.g., degree that vent valve(s) are open, time period(s) that particular valve(s) have been closed). Considering the signals and information received from the measurement system, 844 other sensors 820 and subsystems 812, 818, 822, 836, the control system 832 can discern whether the film deposition process is proceeding as planned. If not, the control system can adapt the process by formulating and selectively providing appropriate control signals to the associated systems 810, 812, 818, 822, 828, 836, to adjust one or more of the systems (e.g., to increase the volume of copper sulfide provided into the chamber and increase the thickness of the layer being deposited).

The control system 832 can include, for example, a processor 856, such as a microprocessor or CPU, coupled to a memory 858. The processor 856 receives measured data from the measuring system 844 and corresponding other data from the other sensors 820 and subsystems 812, 818, 822, 836. The control system 832 can be configured in any suitable manner to control and operate the various components within the system 800 in order to carry out the various functions described herein. The processor 856 can be any of a plurality of processors, and the manner in which the processor 856 can be programmed to carry out the functions relating to the subject invention will be readily apparent to those having ordinary skill in the art based on the description provided herein.

The memory 858 included within the control system 832 serves to store, among other things, program code executed by the processor 856 for carrying out operating functions of the system as described herein. The memory 858 may include read only memory (ROM) and random access memory (RAM). The ROM contains among other code the Basic Input-Output System (BIOS) which controls the basic hardware operations of the system 800. The RAM is the main memory into which the operating system and application programs are loaded. The memory 858 also serves as a storage medium for temporarily storing information such as, for example, thickness tables, chemical composition tables, temperature tables, pressure tables and algorithms that may be employed in carrying out one or more aspects of the subject invention. The memory 858 can also serve as the data store 854 and can hold patterns against which observed data can be compared as well as other data that may be employed in carrying out the subject invention. For mass data storage, the memory 858 may include a hard disk drive.

As a result, the system 800 provides for monitoring aspects associated with the processing occurring within the chamber, such as the thickness of film(s) being deposited, for example. The control system 832 may implement feedback and/or feed forward process control in response to the monitoring so as to deposit conductivity facilitating material, such as copper sulfide, in an efficient and cost effective manner. It will be appreciated that many of the components of the system 800 including the data store can, for example, reside in one physical or logical device (e.g., computer, process) and/or may be distributed between two or more physical or logical devices (e.g., disk drives, tape drives, memory units). Measuring thickness of film being deposited in-situ and adapting processing in response thereto facilitates depositing the copper sulfide at a desired rate, to a desired thickness, with a desired chemical makeup and/or with other desired properties. The conductivity facilitating copper sulfide film can, for example, have a thickness between about 200 to 600 nm, a refractive index from about 2.0 to 2.21, a resistivity of about $5.7 \times 10^{-2}$ Ohm cm and can be transparent with a transmittance of about 60% between 600 and 700 nm. In-situ measurement and feedback and/or feed-forward control enhances product yield and improves resulting device performance, and conductivity facilitating copper sulfide can be deposited under relatively low pressures and temperatures in the absence of toxic hydrogen sulfide ($H_2S$).

Figure 9:
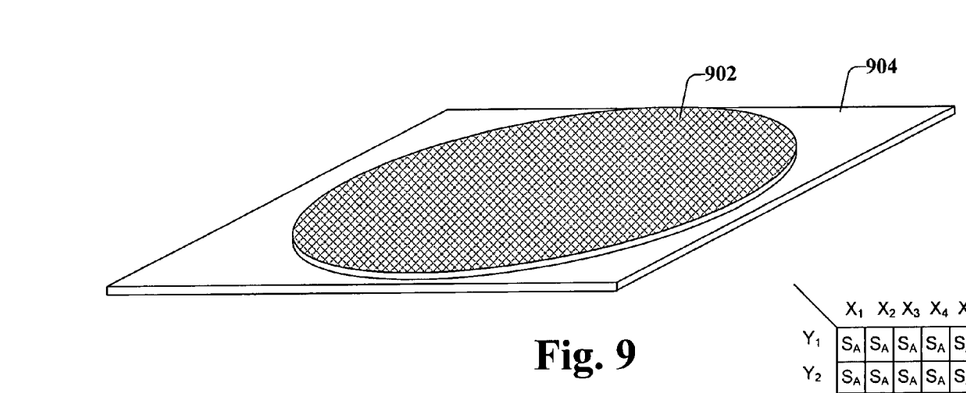
FIG. 9 and FIG. 10 illustrate a wafer having a polymer layer and a partitioned grid pattern for a post treatment procedure according to the subject invention.
Figure 10:
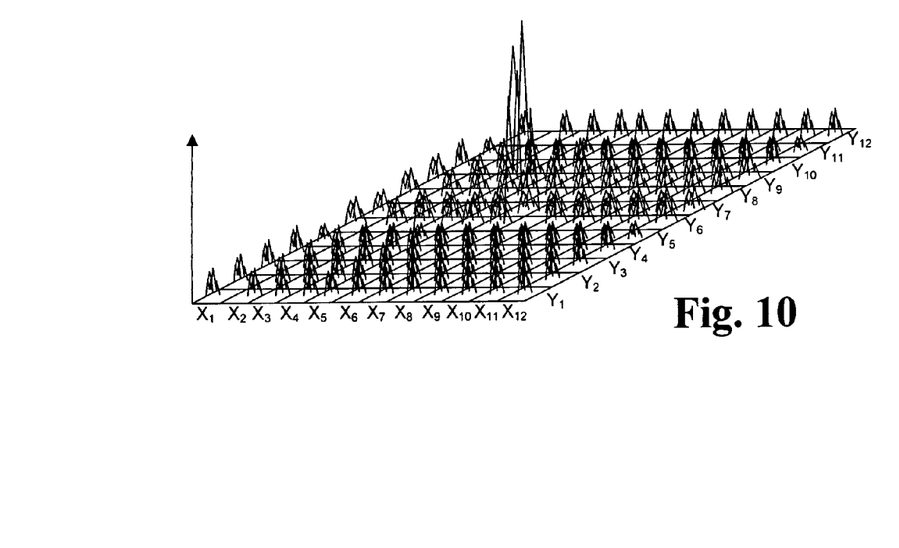
Figure 11:
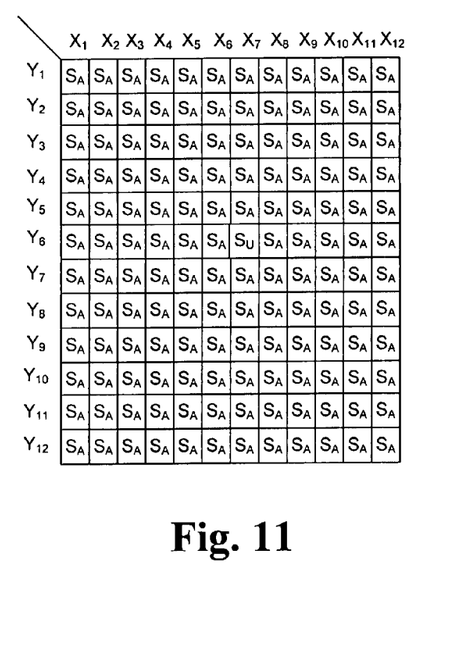
FIG. 11 illustrates a table of signature values for a post treatment procedure according to one aspect of the subject invention.

Turning now to FIGS. 9–11 a chuck 902 is shown in perspective supporting a wafer 904 whereupon conductivity facilitating material, such as copper sulfide, and an SAM with catalyst points according to one aspect of the subject invention can be selectively formed, to manufacture one or more memory cells. The wafer 904 may be logically partitioned into a grid pattern as shown in FIG. 10 to facilitate monitoring the wafer as it matriculates through a fabrication process. Each grid block (XY) of the grid pattern corresponds to a particular portion of the wafer 904, and each grid block may have one or more memory cells associated with that grid block. Portions can be individually monitored with one or more innocuous techniques such as, for example, optical interference, scatterometry, IR spectroscopy, ellipsometry, scanning electron microscopy, synchrotron and/or x-ray diffraction for properties including, but not limited to, thickness of copper sulfide deposited, concentration of copper sulfide deposited, etc. This may facilitate selectively determining to what extent, if any, fabrication adjustments are necessary to mitigate problem areas and achieve desired results.

In FIG. 10, respective plots are illustrated for measurements taken at portions of a wafer 904 corresponding to grid mapped locations of the wafer ($X_1Y_1 \ldots X_{12}, Y_{12}$). The plots can, for example, be signatures indicating whether copper sulfide, the SAM, and the sequential polymer growth for the active layer, are forming at an acceptable rate and/or has been formed to a desired thickness. Given the values depicted in FIG. 10, it may be determined that an undesirable condition exists at one or more locations on the wafer 904. For instance, the measurement at coordinate $X_7Y_6$ yields a plot that is substantially higher than the respective measurements of the other portions XY. This can indicate, for example, that copper sulfide, or polymer growth is accumulating too fast at this location. As such, fabrication components and/or operating parameters associated therewith can be adjusted accordingly to mitigate this condition. For example, the degree that a vent valve is opened can be reduced so that the volume and/or rate of gaseous copper sulfide, and/or DPA added to the process can be restricted. It is to be appreciated that although FIG. 10 illustrates the wafer 904 being mapped (partitioned) into 144 grid block portions, the wafer 904 may be mapped with any suitable number of portions to effect desired monitoring and control.

FIG. 11 illustrates a table of acceptable and unacceptable signature values. As can be seen, all the grid blocks, except grid block $X_7Y_6$, have measurement values corresponding to an acceptable value ($V_A$), while grid block $X_7Y_6$ has an undesired value ($V_U$). Thus, it has been determined that an undesirable condition exists at the portion of the wafer 904 mapped by grid block $X_7Y_6$. Accordingly, fabrication process components and parameters may be adjusted as described herein to adapt the fabrication process accordingly to mitigate the occurrence or persistence of this condition.

Figure 12:
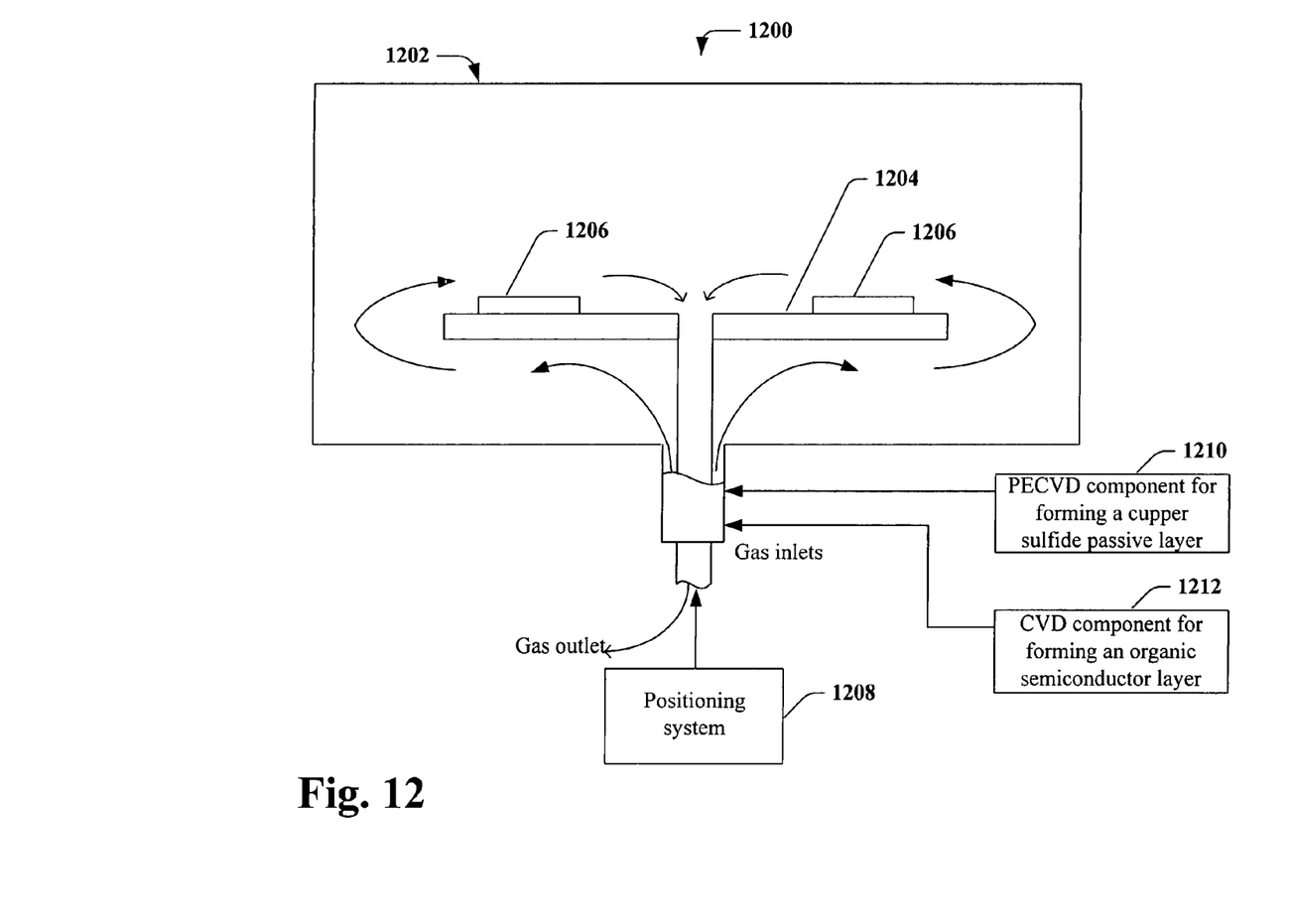
FIG. 12 illustrates a schematic block diagram of a system that fabricates polymer memory cells in accordance with an aspect of the subject invention.

FIG. 12 shows another schematic block diagram illustrating an organic memory cell processing system 1200 for forming a passive layer and an organic semiconductor layer in accordance with one or more aspects of the subject invention. The processing chamber 1202 is configured for receiving and processing wafers in a predefined manner. The chamber 1202 has a cylindrical sidewall that encloses a rotatable chuck 1204 onto which six wafers are mounted for processing. A positioning system 1208 is operatively connected to the rotatable chuck 1204 for selectively maneuvering the wafers 1206 into desired positions within the chamber 1202. The chuck 1204 typically includes a vacuum system (not shown) for holding the wafers on its surface during processing. The chamber 1202 has gas inlets for conveying gases to the chamber 1202 and a gas outlet for removing gases from the chamber 1202. A PECVD component 1210 for forming a cupper sulfide passive layer and a CVD component 1212 for forming an organic semiconductor layer on the cupper sulfide passive layer are connected to the gas inlets.

The PECVD component 1210 for forming a copper sulfide passive layer comprises a plasma-generating component and the gas inlet. The plasma-generating component generates plasma enhanced chemical vapor of hydrogen sulfide and the gas inlet injects the vapor into the chamber 1202. By way of example, the plasma enhanced chemical vapor deposition of copper sulfide can be carried out in argon at a temperature from about 15° C. to about 300° C. and at a pressure from about 0.05 Pa to about 0.5 Pa.

The CVD component 1212 for forming an organic semiconductor layer on the cupper sulfide passive layer comprises a chemical vapor generating component and the gas inlet. The chemical vapor-generating component generates chemical vapor of organic semiconductor and the gas inlet injects the vapor into the chamber 1202 to form the organic semiconductor layer on the passive layer. By way of example, the chemical vapor deposition of organic semiconductor can be carried out in oxygen at a temperature from about 30° C. to about 100° C., and at a pressure from about 0.05 Pa to about 0.5 Pa.

Fabrication of memory cell consists of multiple steps of layer formation. The layers are typically not exposed to air between the formation steps. That is, the layers are not exposed to air because the substrate is not transferred from a chamber to another chamber. Since exposure may cause conductive impurities in the thin film layer, lack of exposure mitigates the introduction of impurities. Therefore, impurities that can negatively impact the quality of the manufactured chip by altering the desired electrical properties of and interactions between components on the manufactured chip would not occur in accordance with the subject invention.

Although the invention has been shown and described with respect to certain illustrated aspects, it will be appreciated that equivalent alterations and modifications will occur to others skilled in the art upon the reading and understanding of this specification and the annexed drawings. In particular, with regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure, which performs the function in the herein illustrated exemplary aspects of the invention. In this regard, it will also be recognized that the invention includes a system as well as a computer-readable medium having computer-executable instructions for performing the acts and/or events of the various methods of the invention.

What is claimed is:

1. A polymer memory cell comprising:
    an active layer anchored via catalyst points to a self assembled monolayer, the active layer changes an impedance state based on a migration of charges therefrom, the active layer fabricated via a reaction of catalyst points with diphenylacetylene; and
    a passive layer that underlies the self assembled monolayer, the passive layer facilitates supply of charges to the active layer, the passive layer and the active layer transfer charges therebetween to store data in the polymer memory cell.

2. The polymer memory cell of claim 1, the passive layer is copper sulfide.

3. The polymer memory cell of claim 2, the self assembled monolayer has terminal acetylene linkages.

4. The polymer memory cell of claim 1, the active layer comprises molecular units with redox-active metals.

5. The polymer memory cell of claim 4, the redox active metals comprise at least one of: metallocenes complex and polypyridine metal complex.

6. The polymer memory cell of claim 1, the active layer comprises at least one of: polyphenylacetylene, polydiphenylacetylene and related derivative bearing functional groups of nitro, methyl and methoxy.

7. The polymer memory cell of claim 1, the active layer comprises at least one of: hydrocarbons; organic molecules with donor and acceptor properties, metallo-organic complexes; porphyrin, phthalocyanine, and hexadecafluoro phthalocyanine.

8. The polymer memory cell of claim 7, the organic molecules with donor acceptor properties comprises at least one of: N-Ethylcarbazole, tetrathiotetracene, tetrathiofulvalene, tetracyanoquinodimethane, tetracyanoethylene, cloranol, and dinitro-n phenyl.

9. The polymer memory cell of claim 7, the metallo-organic complexes are selected from the group of bisdiphenylglyoxime, bisorthophenylenediimine, and tetraaza-tetramethylannulene.

10. The polymer memory cell of claim 1, the active layer comprises organic material selected from the group comprising of polyacetylene, polyphenylacetylene, polydiphenylacetylene.

11. The polymer memory cell of claim 1, the active layer comprises material selected from the group comprising of electric dipole elements, polymer ferroelectrics clusters, non-organic ferro-electrics, salts, alkalis, acids, and water molecules.

12. The polymer memory cell of claim 1, the active layer is formed via at least one of a gas-phase reaction or CVD.

13. A method of fabricating the polymer memory cell of claim 1, comprising;
   forming the self assembled monolayer with a plurality of active catalyst points over the passive layer; and
   subjecting the self assembled monolayer to a monomer to initiate sequential polymer growth from the active catalyst spots.

14. The method of claim 13 further comprising monitoring formation of polymer growth on the self assembled monolayer.

15. The method of claim 13, the subjecting act further comprises introducing the diphenylacetylene as a gaseous medium to interact with the self assembled monolayer.

16. The method of claim 14 further comprising dividing a wafer surface to plurality of grid blocks to monitor polymer growth thereon.

17. The method of claim 16 further comprising creating a feed back loop to control polymer growth over the passive layer.

18. The method of claim 16 further comprising determining polymer growth rates of the polymer memory cell via signature comparisons.

19. A memory cell formed by a method, comprising:
   depositing a passive layer over a lower conductive electrode;
   exposing the passive layer to a self-assembled monolayer monomer containing a terminal acetylene unit;
   forming a self-assembled monolayer with catalyst spots over the passive layer; and
   re-initiating sequential polymer growth at the catalyst spots by introducing gas phase diphenylacetylene.

20. The memory cell of claim 19, the passive layer is copper sulfide.

* * * * *